United States Patent
Oganesian (10) Patent No.: US 9,996,725 B2
(45) Date of Patent: Jun. 12, 2018

(54) UNDER SCREEN SENSOR ASSEMBLY

(71) Applicant: Optiz, Inc., Palo Alto, CA (US)

(72) Inventor: Vage Oganesian, Sunnyvale, CA (US)

(73) Assignee: Optiz, Inc., Palo Alto, CA (US)

( * ) Notice: Subject to any disclaimer, the term of this patent is extended or adjusted under 35 U.S.C. 154(b) by 97 days.

(21) Appl. No.: 15/343,141

(22) Filed: Nov. 3, 2016

(65) Prior Publication Data

US 2018/0121705 A1    May 3, 2018

(51) Int. Cl.
*G06K 9/00* (2006.01)

(52) U.S. Cl.
CPC .............. *G06K 9/00053* (2013.01)

(58) Field of Classification Search
CPC .............................. G06K 9/00053
See application file for complete search history.

(56) References Cited

U.S. PATENT DOCUMENTS

| | | |
|---|---|---|
| 5,037,779 A | 8/1991 | Whalley et al. |
| 5,578,525 A | 11/1996 | Mizukoshi |
| 6,627,864 B1 | 9/2003 | Glenn |
| 6,777,767 B2 | 8/2004 | Badehi |
| 6,972,480 B2 | 12/2005 | Zilber et al. |
| 7,033,664 B2 | 4/2006 | Zilber et al. |
| 7,157,742 B2 | 1/2007 | Badehi |
| 7,192,796 B2 | 3/2007 | Zilber et al. |
| 7,265,440 B2 | 9/2007 | Zilber et al. |
| 7,456,901 B2 | 11/2008 | Jeong et al. |
| 7,495,341 B2 | 2/2009 | Zilber et al. |
| 7,569,409 B2 | 8/2009 | Lin et al. |
| 7,576,401 B1 | 8/2009 | De Guzman et al. |
| 7,589,422 B2 | 9/2009 | Lee et al. |
| 7,642,629 B2 | 1/2010 | Zilber et al. |
| 7,664,390 B2 | 2/2010 | Cho et al. |
| 7,859,033 B2 | 12/2010 | Brady |
| 8,164,177 B2 | 4/2012 | Matz et al. |
| 8,183,579 B2 | 5/2012 | Wang |
| 8,432,011 B1 | 4/2013 | Oganesian |
| 8,546,900 B2 | 10/2013 | Oganesian |
| 8,546,951 B2 | 10/2013 | Oganesian |
| 8,552,518 B2 | 10/2013 | Oganesian |

(Continued)

FOREIGN PATENT DOCUMENTS

| | | |
|---|---|---|
| JP | 2004-165191 | 6/2004 |
| KR | 1020090102208 | 9/2009 |

(Continued)

*Primary Examiner* — Jonathan S Lee
(74) *Attorney, Agent, or Firm* — DLA Piper LLP (US)

(57) ABSTRACT

A sensor assembly that includes a silicon substrate and a sensor integrally formed on or in its top surface. Bond pads are formed at the substrate top surface and electrically coupled to the sensor. A trench is formed into the top surface, extending toward but not reaching the substrate's bottom surface. Conductive first traces each extend from one of the bond pads and down into the trench. One or more holes are formed into the bottom surface of the substrate and extend toward but do not reach the top surface. The one or more holes terminate at the bottom of the trench in a manner exposing the conductive first traces. Conductive second traces each extend from one of the conductive first traces at the bottom of the trench, along a sidewall of the one or more holes, and along the bottom surface of the silicon substrate.

27 Claims, 13 Drawing Sheets

(56) References Cited

U.S. PATENT DOCUMENTS

| | | |
|---|---|---|
| 8,570,669 B2 | 10/2013 | Oganesian |
| 8,604,576 B2 | 12/2013 | Oganesian |
| 8,692,344 B2 | 4/2014 | Oganesian |
| 8,759,930 B2 | 6/2014 | Oganesian |
| 8,773,929 B1 | 7/2014 | Lesea |
| 8,796,800 B2 | 8/2014 | Oganesian |
| 8,921,759 B2 | 12/2014 | Oganesian |
| 9,018,725 B2 | 4/2015 | Oganesian |
| 9,142,695 B2* | 9/2015 | Oganesian ......... H01L 31/0203 |
| 9,233,511 B2 | 1/2016 | Oganesian |
| 9,893,213 B2* | 2/2018 | Oganesian ....... H01L 31/02002 |
| 2004/0080642 A1 | 4/2004 | Kobayashi et al. |
| 2004/0142539 A1 | 7/2004 | Koizumi |
| 2004/0157426 A1* | 8/2004 | Ouellet ............. B81C 1/00246 438/618 |
| 2004/0251525 A1 | 12/2004 | Zilber |
| 2005/0051859 A1 | 3/2005 | Hoffman |
| 2005/0104179 A1 | 5/2005 | Zilber |
| 2005/0104186 A1 | 5/2005 | Yang |
| 2005/0139848 A1 | 6/2005 | Yee |
| 2005/0205977 A1 | 9/2005 | Zilber |
| 2007/0054419 A1 | 3/2007 | Paik et al. |
| 2007/0138498 A1 | 6/2007 | Zilber |
| 2007/0190691 A1 | 8/2007 | Humpston |
| 2007/0190747 A1 | 8/2007 | Humpston |
| 2008/0012115 A1 | 1/2008 | Zilber |
| 2008/0017879 A1 | 1/2008 | Zilber |
| 2008/0083976 A1 | 4/2008 | Haba |
| 2008/0083977 A1 | 4/2008 | Haba |
| 2008/0099900 A1 | 5/2008 | Oganesian |
| 2008/0099907 A1 | 5/2008 | Oganesian |
| 2008/0116544 A1 | 5/2008 | Grinman |
| 2008/0116545 A1 | 5/2008 | Grinman |
| 2008/0150121 A1 | 6/2008 | Oganesian |
| 2008/0164413 A1 | 7/2008 | Shibayama |
| 2008/0185671 A1 | 8/2008 | Huang |
| 2008/0191343 A1 | 8/2008 | Liu |
| 2008/0246136 A1 | 10/2008 | Haba |
| 2008/0265350 A1 | 10/2008 | Wu et al. |
| 2009/0038843 A1 | 2/2009 | Yoneda et al. |
| 2009/0115047 A1 | 5/2009 | Haba |
| 2009/0160065 A1 | 6/2009 | Haba |
| 2009/0212381 A1 | 8/2009 | Crisp |
| 2009/0284631 A1 | 11/2009 | Matsuo |
| 2009/0309177 A1 | 12/2009 | Jeung et al. |
| 2009/0316378 A1* | 12/2009 | Haba ................. H01L 23/3114 361/808 |
| 2010/0002107 A1 | 1/2010 | Harazono |
| 2010/0032781 A1 | 2/2010 | Ryu |
| 2010/0053318 A1 | 3/2010 | Sasaki |
| 2010/0053407 A1 | 3/2010 | Crisp |
| 2010/0200898 A1 | 8/2010 | Lin et al. |
| 2010/0225006 A1 | 9/2010 | Haba |
| 2010/0230812 A1 | 9/2010 | Oganesian |
| 2010/0237452 A1 | 9/2010 | Hagiwara et al. |
| 2010/0244171 A1 | 9/2010 | Nagamatsu et al. |
| 2011/0012259 A1 | 1/2011 | Grinman |
| 2011/0024610 A1 | 2/2011 | Tu et al. |
| 2011/0031629 A1 | 2/2011 | Haba |
| 2011/0033979 A1 | 2/2011 | Haba |
| 2011/0049696 A1 | 3/2011 | Haba |
| 2011/0108940 A1 | 5/2011 | Huang et al. |
| 2011/0187007 A1 | 8/2011 | Haba |
| 2012/0007199 A1* | 1/2012 | Li ..................... H01L 27/14618 257/432 |
| 2012/0018863 A1 | 1/2012 | Oganesian |
| 2012/0018868 A1 | 1/2012 | Oganesian |
| 2012/0018893 A1 | 1/2012 | Oganesian |
| 2012/0018894 A1 | 1/2012 | Oganesian |
| 2012/0018895 A1 | 1/2012 | Oganesian |
| 2012/0020026 A1 | 1/2012 | Oganesian |
| 2012/0043635 A1 | 2/2012 | Yang |
| 2012/0068327 A1 | 3/2012 | Oganesian |
| 2012/0068330 A1 | 3/2012 | Oganesian |
| 2012/0068351 A1 | 3/2012 | Oganesian |
| 2012/0068352 A1 | 3/2012 | Oganesian |
| 2012/0180563 A1* | 7/2012 | Wang ................... G01F 1/6845 73/204.26 |
| 2013/0056844 A1 | 3/2013 | Oganesian |
| 2013/0168740 A1* | 7/2013 | Chen ................. B81C 1/00238 257/254 |
| 2013/0168791 A1 | 7/2013 | Oganesian |
| 2013/0249031 A1 | 9/2013 | Oganesian |
| 2013/0280864 A1 | 10/2013 | Bachman |
| 2014/0015086 A1 | 1/2014 | Yu et al. |
| 2014/0035078 A1 | 2/2014 | Jan |
| 2014/0041214 A1 | 2/2014 | Barlow |
| 2014/0353789 A1* | 12/2014 | Oganesian .......... H01L 31/0203 257/432 |
| 2016/0049526 A1* | 2/2016 | Oganesian ........ H01L 31/02002 257/434 |
| 2017/0222065 A1* | 8/2017 | Oganesian .............. H01L 29/87 |

FOREIGN PATENT DOCUMENTS

| | | |
|---|---|---|
| KR | 1020100011648 | 2/2010 |
| KR | 1020120018713 A | 3/2012 |
| KR | 1020130010847 | 1/2013 |
| KR | 1020130056161 A | 5/2013 |
| KR | 1020130083846 A | 7/2013 |

* cited by examiner

UNDER SCREEN SENSOR ASSEMBLY

FIELD OF THE INVENTION

The present invention relates to sensors used in electronic devices such as cell phones.

BACKGROUND OF THE INVENTION

Electronic devices, particularly, mobile electronic devices, are becoming more prevalent. The data being handled in these devices is growing in both quantity and sensitivity. A superior security device is needed to protect users from potential harm. The novel security device must excel in accuracy, form factor and usability.

Conventional fingerprint sensor devices are known. See for example U.S. Pat. No. 8,358,816. Such devices use a linear light sensor to capture the user's fingerprint. If the captured fingerprint matches that of the user, then access to the electronic device is granted. However, the linear light sensor can be hacked, thus making it a weak security device. For example, one could simply print out a fingerprint on a sheet of paper and pass it over the sensor. The linear sensor is incapable of making any distinction between a fake paper copy and a real finger. The linear sensor requires the user to make a swiping motion. The swipe has to be precise and well positioned, thus making it sometimes difficult to use. Packages for this device are not usually designed with a small enough form factor and effective device integration. The packaging is typically bulky, and generally needs a specially designed device cover with a window.

BRIEF SUMMARY OF THE INVENTION

The aforementioned problems and needs are addressed by a sensor assembly that includes a silicon substrate having opposing top and bottom surfaces, a sensor integrally formed on or in the top surface of the silicon substrate, a plurality of bond pads formed at the top surface of the silicon substrate and electrically coupled to the sensor, a trench formed into the top surface of the silicon substrate and extending toward but not reaching the bottom surface, a plurality of conductive first traces each extending from one of the bond pads, along the top surface of the silicon substrate, along a sidewall of the trench and along a bottom of the trench, one or more holes formed into the bottom surface of the silicon substrate and extending toward but not reaching the top surface wherein the one or more holes terminating at the bottom of the trench in a manner exposing the plurality of conductive first traces, and a plurality of conductive second traces each extending from one of the conductive first traces at the bottom of the trench, along a sidewall of the one or more holes, and along the bottom surface of the silicon substrate.

A cell phone that includes a front screen, a visual display disposed under and viewable through the front screen, a sensor assembly disposed under and sensing an area of the front screen, and control electronics electrically connected to the sensor assembly and the visual display. The sensor assembly includes a silicon substrate having opposing top and bottom surfaces, a sensor integrally formed on or in the top surface of the silicon substrate, a plurality of bond pads formed at the top surface of the silicon substrate and electrically coupled to the sensor, a trench formed into the top surface of the silicon substrate and extending toward but not reaching the bottom surface, a plurality of conductive first traces each extending from one of the bond pads, along the top surface of the silicon substrate, along a sidewall of the trench and along a bottom of the trench, one or more holes formed into the bottom surface of the silicon substrate and extending toward but not reaching the top surface, wherein the one or more holes terminating at the bottom of the trench in a manner exposing the plurality of conductive first traces, and a plurality of conductive second traces each extending from one of the conductive first traces at the bottom of the trench, along a sidewall of the one or more holes, and along the bottom surface of the silicon substrate.

A sensor assembly, includes a silicon substrate having opposing top and bottom surfaces, a sensor integrally formed on or in the top surface of the silicon substrate, a plurality of first bond pads formed at the top surface of the silicon substrate and electrically coupled to the sensor, a trench extending between the top and bottom surfaces, a plurality of second bond pads extending across the trench at the bottom surface, and a plurality of wires each extending from one of the first bond pads, into the trench and to one of the second bond pads, and a plurality of conductive traces each extending from one of the second bond pads and along the bottom surface of the silicon substrate.

A method of forming a sensor assembly includes providing a sensor die (that has a silicon substrate having opposing top and bottom surfaces, a sensor integrally formed on or in the top surface of the silicon substrate, and a plurality of first bond pads formed at the top surface of the silicon substrate and electrically coupled to the sensor), forming a trench into the top surface of the silicon substrate that extends toward but does not reach the bottom surface, forming second bond pads at a bottom of the trench, connecting a plurality of wires between the first bond pads and the second bond pads, filling the trenches with insulation material, recessing the bottom surface of the silicon substrate to expose the second bond pads, and forming a plurality of conductive traces each extending from one of the second bond pads and along the bottom surface of the silicon substrate.

Other objects and features of the present invention will become apparent by a review of the specification, claims and appended figures.

DETAILED DESCRIPTION OF THE INVENTION

The present invention relates to biometrics identification (fingerprint) sensor, packaging of fingerprint sensor and the integration of such a device. The present invention uses a range of sensory devices to achieve optimal reading of the fingerprint, using sensory techniques such as capacitance, electromagnetism, and infrared and photonic sensing. The present invention also includes ultra-thin packaging and device integration, where the sensor can be disposed directly underneath the top screen of handset device for fingerprint recognition and authentication.

Figure 1A:
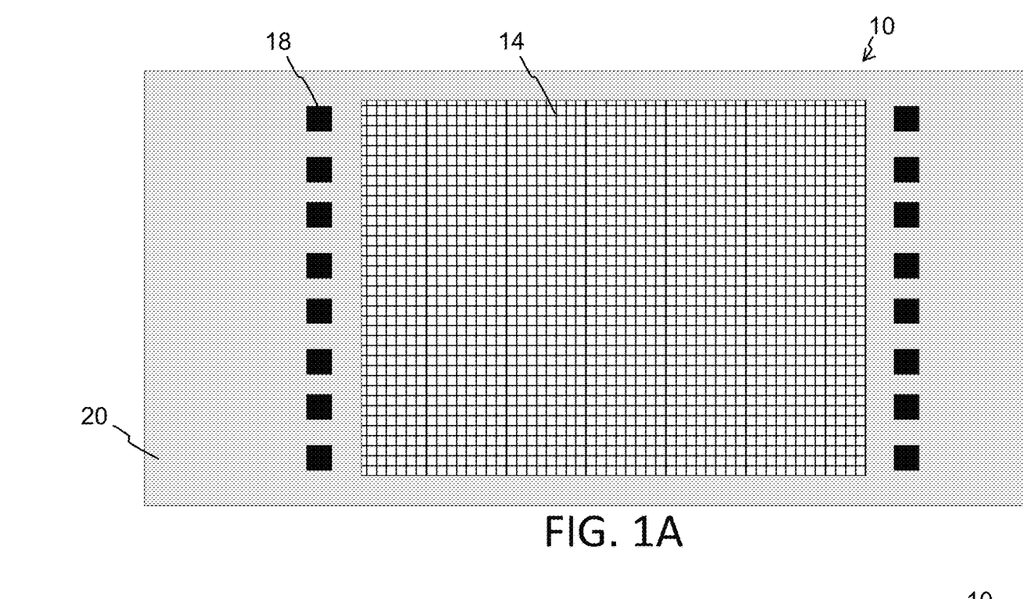
FIGS. 1A-1E are top views illustrating the steps in forming the sensor assembly of the present invention.
Figure 1B:
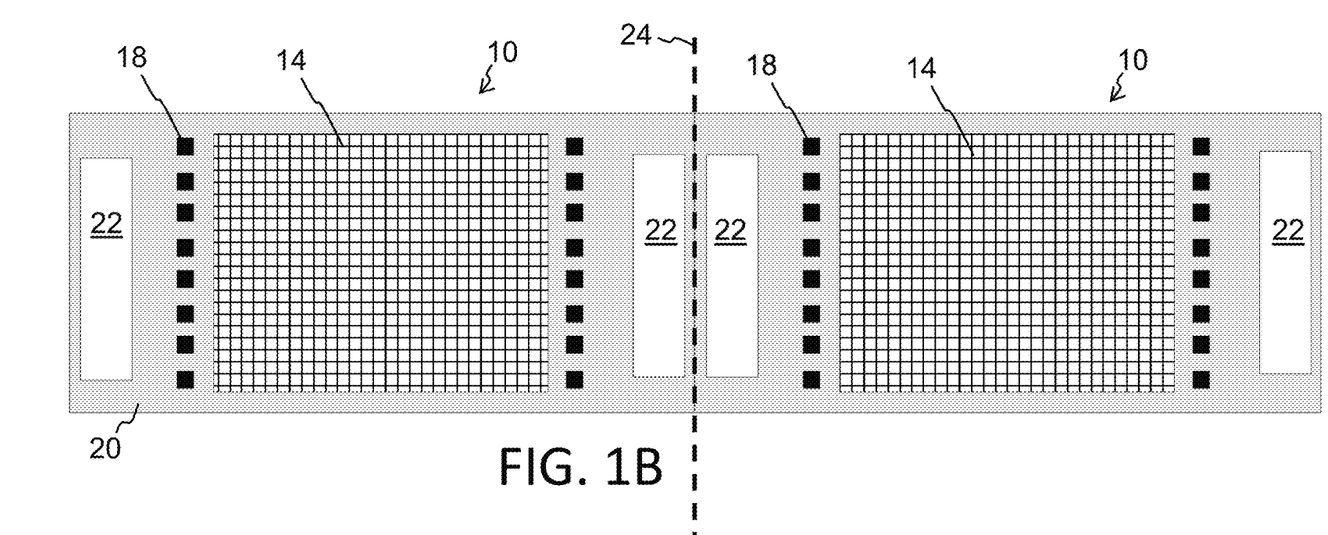
Figure 1C:
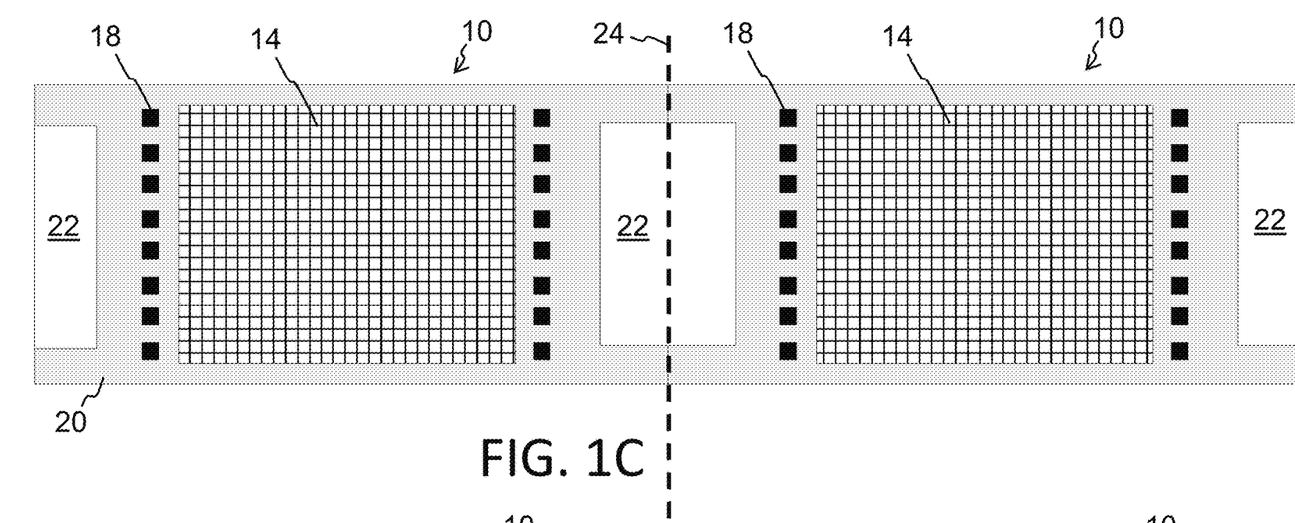
Figure 1D:
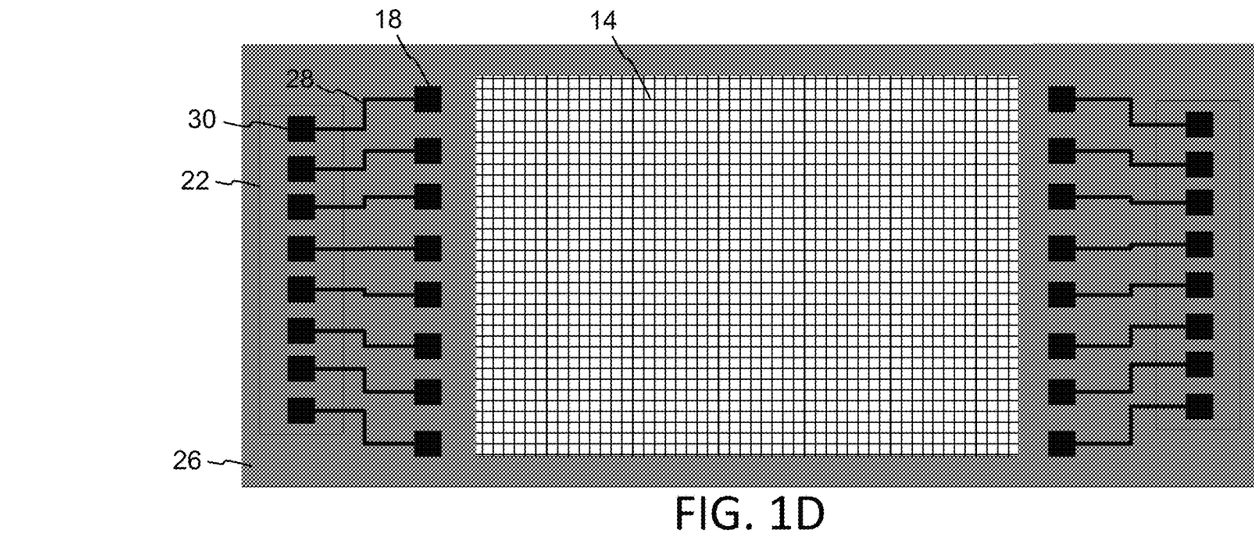

FIGS. 1A-1E and 2A-2M illustrate the steps in forming the packaged sensor assembly of the present invention. The process begins by providing a sensor assembly 10 shown as shown in FIG. 1A (top view) and 2A (side cross sectional view). The sensor assembly 10 includes a silicon substrate 12, as well as a sensor 14, supporting circuitry 16 for the sensor 14, bond pads 18 electrically connected to the sensor 14 and/or circuitry 16 (for off-chip signaling), and dielectric layers 20, all formed at or in the top surface of the substrate 12. The sensor 14 constitutes the active area of the sensor assembly 10, and can be any type of sensor such as a capacitive sensor, an electromagnetic sensor, an ultrasonic sensor, a temperature sensor, a pressure sensor, and/or a photonic sensor. Sensor 14 preferably includes multiple sensors of different types that are placed side-by-side, over the top of another, or interlaced. For example, a photonic sensor can be used to detect the fingerprint information off of a finger passed over the sensor 14, while one or more other types of sensors listed above can be used to confirm that the optically sensed finger print originates from an actual finger rather than some printed or other fake media. The other one or more sensors can also assist in capturing and/or confirming the sensed finger print data. It should be appreciated that while only one sensor assembly 10 is shown in FIGS. 1A and 2A, there are a plurality of such assemblies formed on a single wafer substrate 12.

Figure 2A:
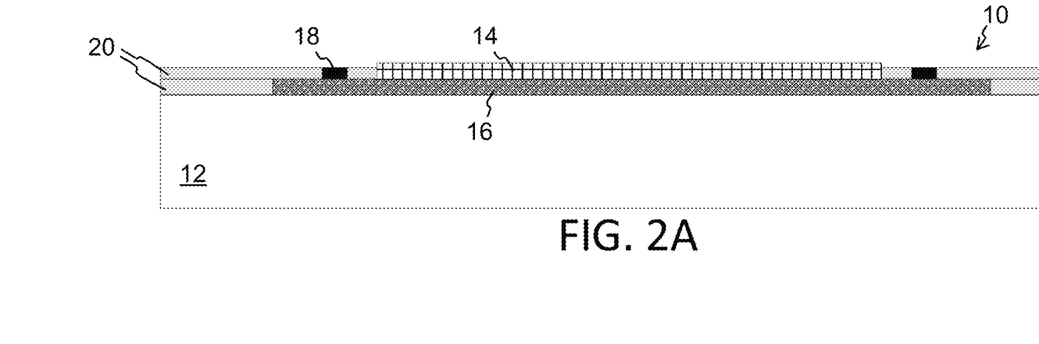
FIGS. 2A-2M are side cross sectional views illustrating the steps in forming the sensor assembly of the present invention.
Figure 2B:
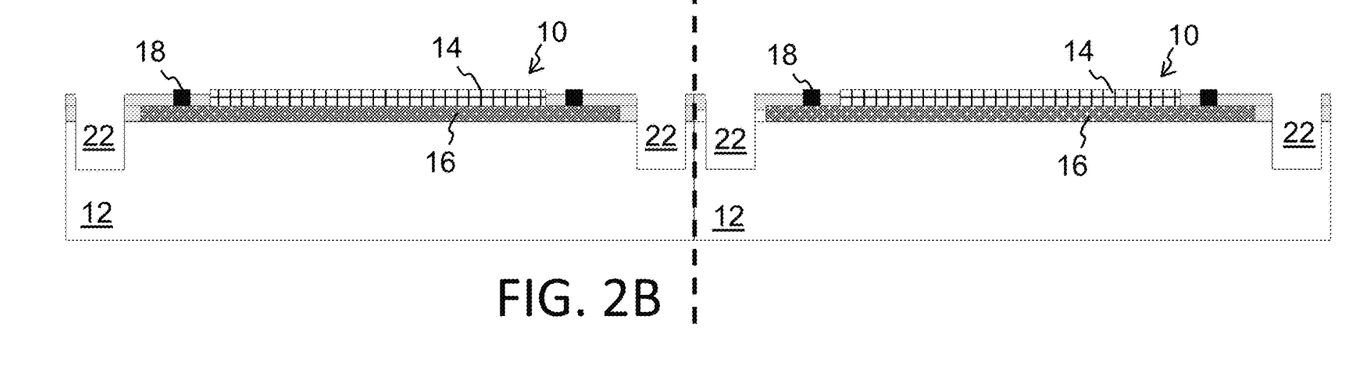
Figure 2C:
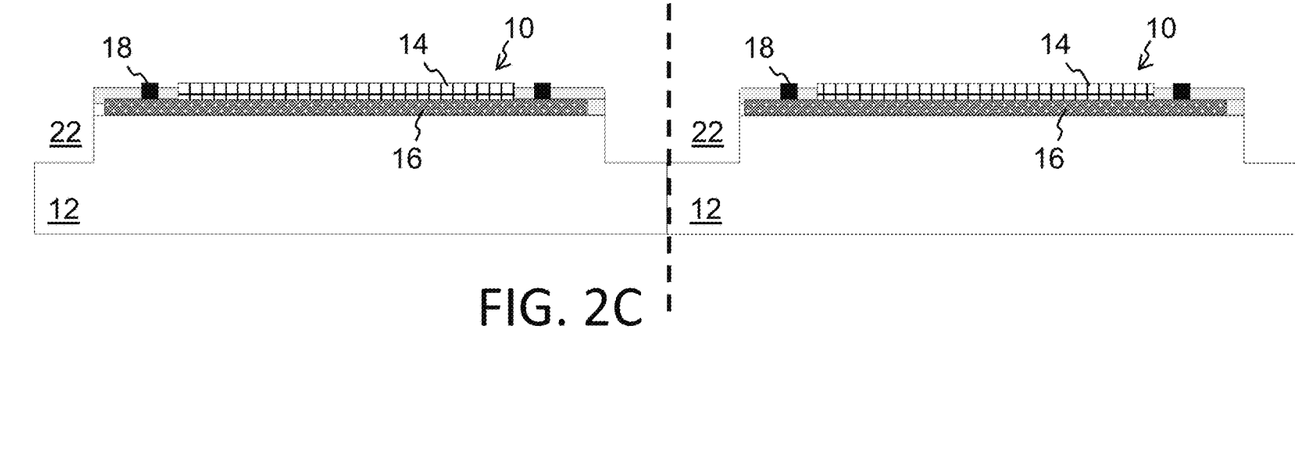

Trenches 22 are formed through the dielectric layers 20 and into the top surface the substrate 12 in areas of the substrate 12 between the bond pads 18 of two neighboring sensor assemblies 10. Trenches 22 can be formed using a photolithographic process, and anisotropic dry etch process to etch through the dielectric layer 20 and into the silicon substrate 12. Mechanical sawing or any other mechanical milling process can also be used to form the trenches 22. There can be two trenches between neighboring sensor assemblies as shown in FIGS. 1B and 2B, where one trench 22 is on either side of the scribe line 24 along which the wafer will be diced. Alternately, there can be a single trench 22 that extends across the scribe line 24 as shown in FIGS. 1C and 2C. The trenches 22 can have vertical sidewalls as shown, or slanted. Trenches 22 can be formed on two opposing sides of the sensor 14 as shown, or on all four sides of the sensor 14. Preferably, the length of trench 22 is less than the corresponding length of the sensor 14 and bond pads 18.

Figure 2D:
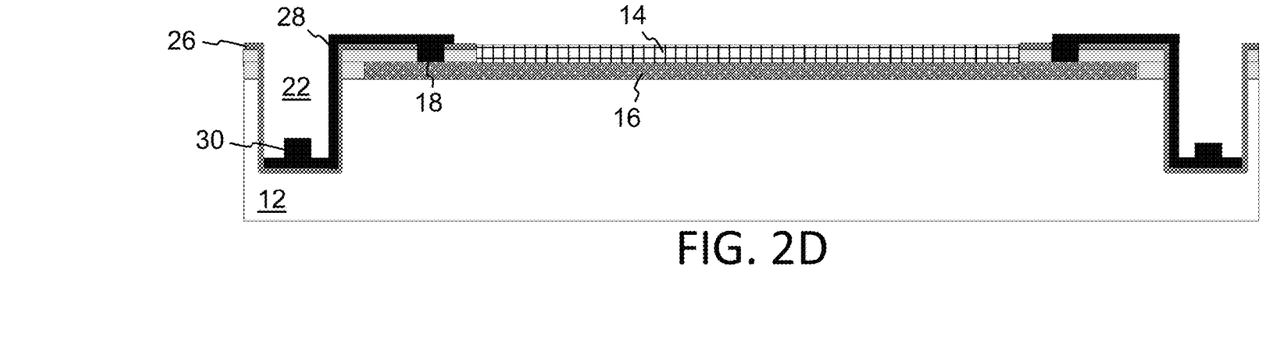

Insulation material 26 is randomly (or pseudo randomly) deposited on the structure except for areas over bond pads 18 and sensor 14. Insulation material 26 can be, for example, silicon dioxide or silicon nitride. Preferably, insulation material 26 is silicon dioxide having a thickness of at least 0.5 µm. Insulation material 26 can be formed by Plasma Enhanced Chemical Vapor Deposition (PECVD) or any another appropriate deposition method(s), followed by a photolithography process and etch to remove portions of the insulation material over the bond pads 18 and sensor 14. A conductive material such as an aluminum alloy, copper/titanium or any other conductive material that is well known in the art is formed over the structure (preferably aluminum deposited by sputtering), and then selectively removed using a photolithographic and etch process except for electrical traces 28 and bond pads 30 thereof. Each trace 28 extends from one of bond pads 18, along insulation material 26 and down along the sidewall of one of the trenches 22, and terminates in a bond pad 30 at the bottom of the trench 22, as shown in FIGS. 1D and 2D.

Figure 1E:
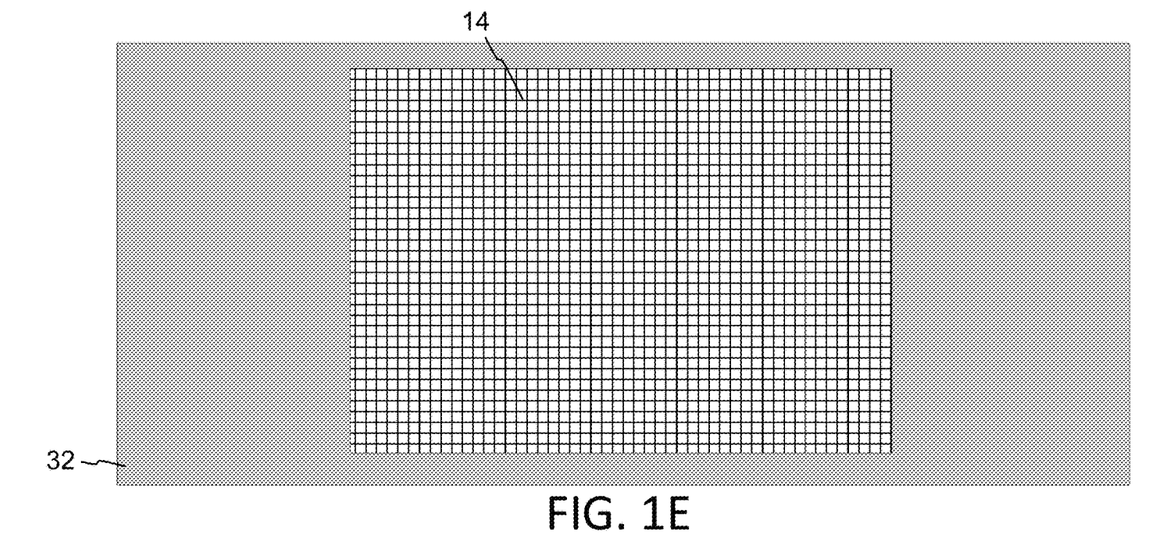
Figure 2E:
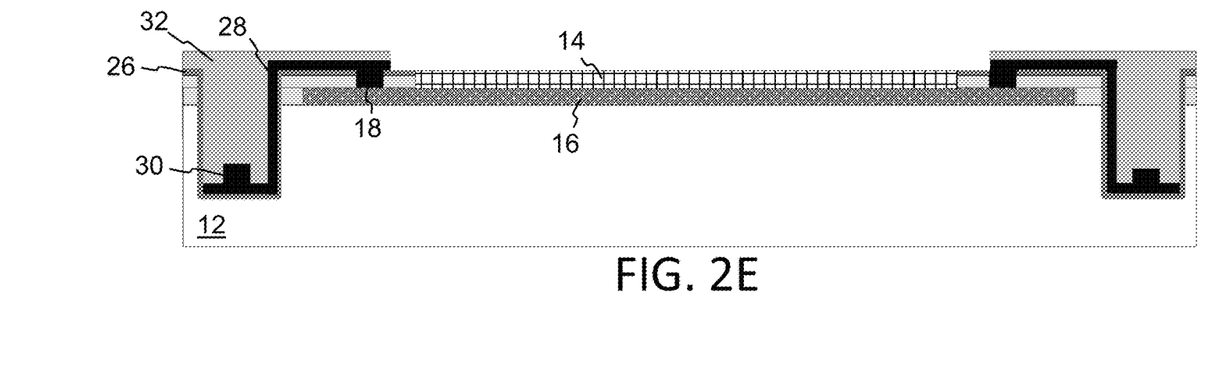

A dielectric (insulation) encapsulant material 32 can be randomly (or pseudo randomly) deposited on the structure including in trenches 22, while leaving the sensor 14 exposed, as shown in FIGS. 1E and 2E. Dielectric material 32 can be silicon dioxide, silicon nitride, photo-imagable polymer, epoxy, or other suitable material. Preferably, dielectric material 32 is made of a photo-imagable polymer. The photo-imagable material deposition method can be spin and/or spray coating or any another appropriate deposition method(s), followed by selective removal using a photolithographic and etch process to expose sensor 14. Encapsulant material 32 will act as a supportive layer for trace 28 and bond pad 30 at the bottom of trench 22.

Figure 2F:
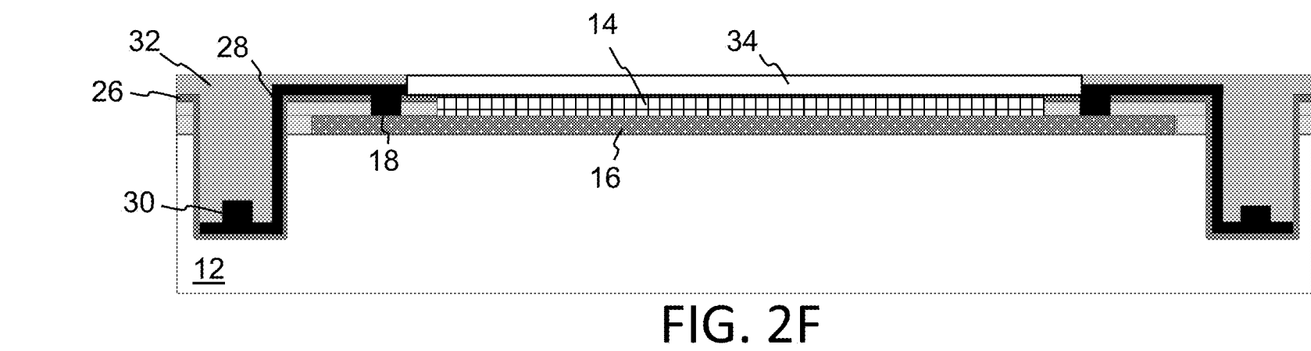
Figure 2G:
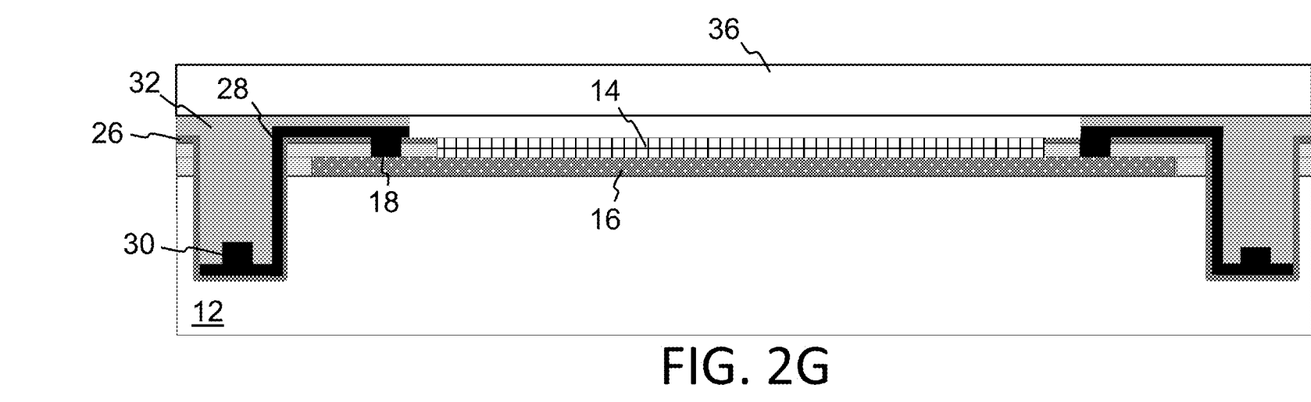
Figure 2H:
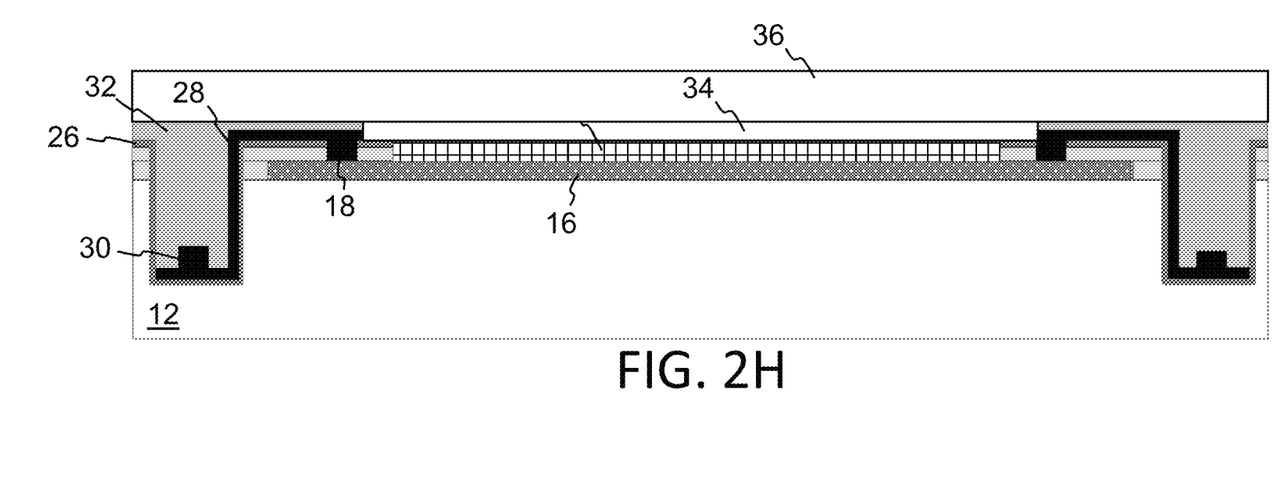

The sensor 14 can be protected by a transparent/semi-transparent substrate and/or by a protective film coating over the sensor 14. Protective material 34 can be randomly (or pseudo randomly) deposited on the entire surface and selectively removed so that it covers the sensor 14 as shown in FIG. 2F. Protective material 34 can be silicon dioxide or silicon nitride or any suitable polymer material. Preferably, protective material 34 is made of at least 0.5 µm of silicon dioxide and silicon nitride, deposited by Physical Vapor Deposition (PVD) or any another appropriate deposition method(s). Alternatively, the sensor 14 can be protected by a semitransparent or transparent substrate 36, which is bonded to the sensor active side using adhesive epoxy material, as shown in FIG. 2G. Bonding can be performed using wafer pressure bonding or spin bonding equipment. As shown in FIG. 2H, the sensor 14 can be protected by both the protective material 34 and the substrate 36.

Figure 2I:
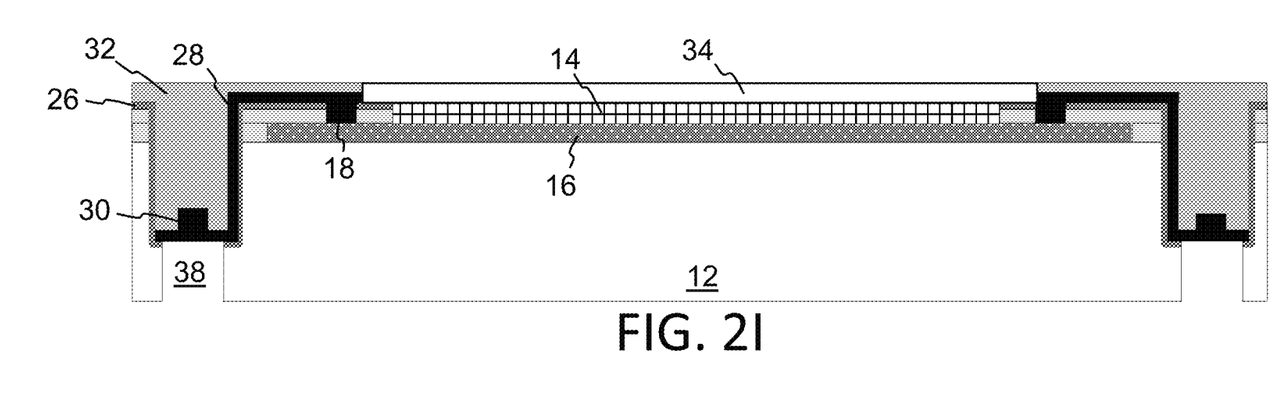

Silicon thinning can be performed on the bottom surface of substrate 12 by mechanical grinding, chemical mechanical polishing (CMP), wet etching, atmospheric downstream plasma (ADP), dry chemical etching (DCE), a combination of aforementioned processes or any another appropriate silicon thinning method(s). The preferred thickness of substrate 12 after thinning is approximately 150 microns. Holes (vias) 38 are then formed into the bottom surface of the substrate 12, each extending from the bottom surface of the substrate 12 to the bottom of one of the trenches 22, and through insulation layer 26 so that trace 28 and/or its bond pad 30 is exposed, as shown in FIG. 2I. Encapsulant material 32 will act as a supportive layer for trace 28 and bond pad 30 at the bottom of trench 22 during and after holes 38 are formed. The holes 38 can be formed by laser, combination of lithography and etch (plasma or chemical) processes or any another appropriate method. Preferably, there is an individual hole 38 for each bond pad 30. Alternately a single hole 38 can contain multiple bond pads 30 in a manner similar to that of trenches 22.

Figure 2J:
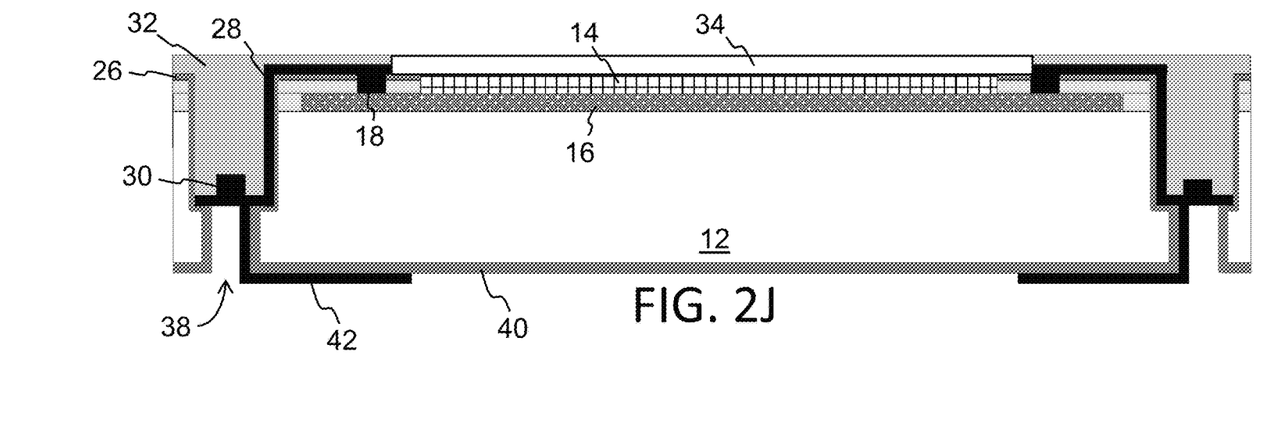

Insulation material 40 is formed on the bottom surface of the substrate 12, including in holes 38. Insulation material 40 can be silicon dioxide, silicon nitride or photo-imagable polymer material. Preferably, insulation material 40 is made of at least 0.5 µm of silicon dioxide, formed by Physical Vapor Deposition (PVD) or any another appropriate deposition method(s). A photolithography process and dry plasma etch is used to remove portions of the insulation material 40 over the traces 28 or bond pad area 30 thereof in holes 38. A conductive layer is formed on the bottom surface of substrate 12, and selectively removed using photolithographic etching to form conductive traces 42. Each trace 42 extends from one of the traces 28, along the sidewall of one of the holes 38, and out along the layer 40 along bottom surface of substrate 12, as shown in FIG. 2J. Traces 42 can be formed of aluminum, copper or any other conductive material(s) that are well known in the art. Optionally, traces 42 can be Ni/Au or Ni/Pd/Au (nickel/palladium/gold) plated.

Figure 2K:
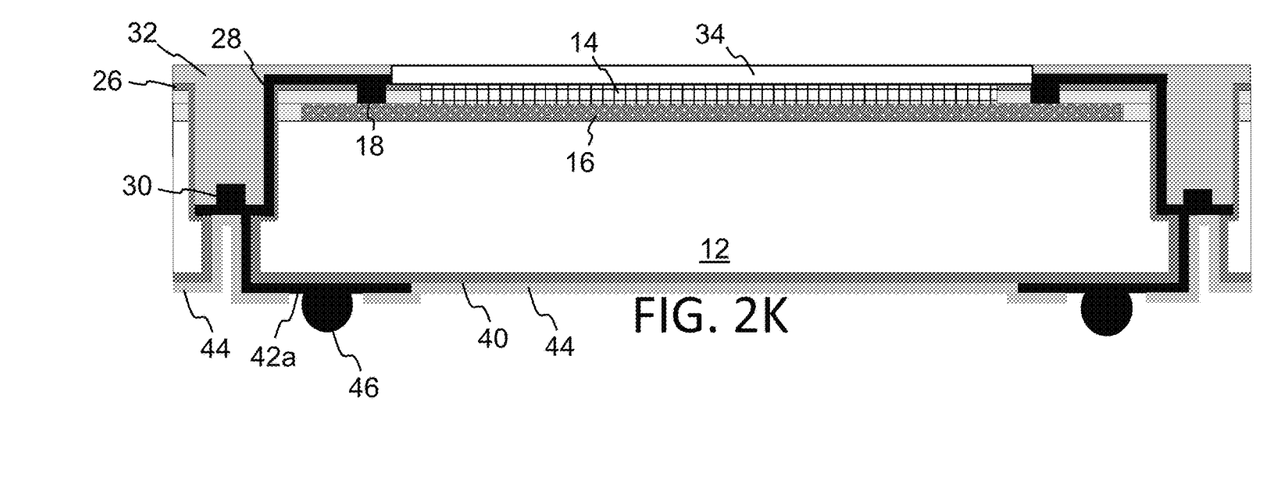

An encapsulant insulation layer 44 can be deposited on the entire bottom surface of the substrate 12 and traces 42, and selectively removed by photolithography and etch to leave exposed contact pad portions 42a of traces 42. Insulation layer 44 can be silicon dioxide, silicon nitride, photo-imagable polymer, or an epoxy. Preferably, insulation layer 44 is made of photo-imagable polymer. Interconnects 46 can be formed on the contact pad portions 42a. Interconnects 46 can be ball grid array (BGA), land grid array (LGA), plated bump, adhesive bump, stud bump or any other appropriate interconnection technique. Preferably, interconnects 46 are BGA as shown in FIG. 2K.

Figure 2L:
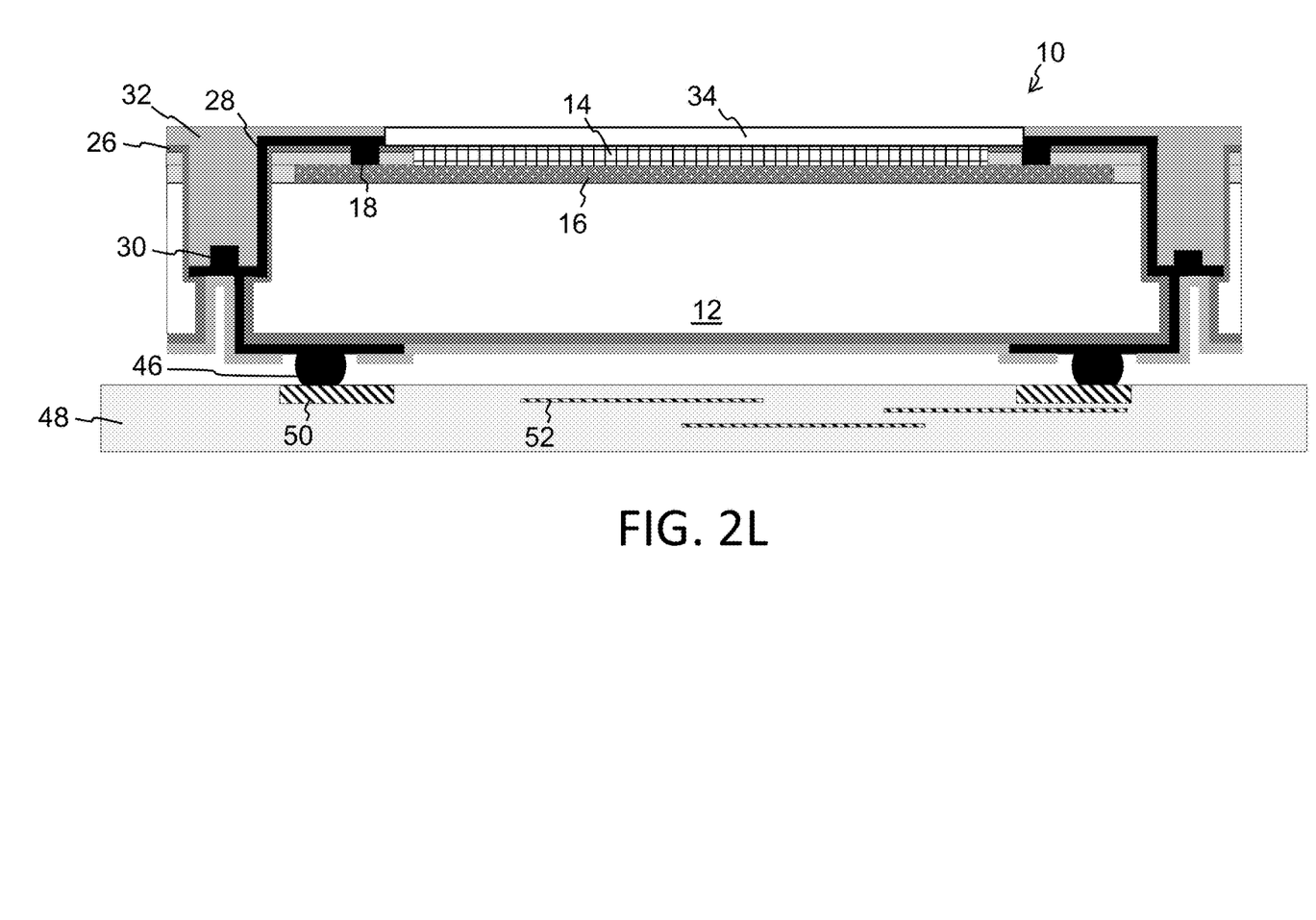

Wafer level dicing/singulation of components can be done with mechnical blade dicing equipment, laser cutting or any other apporiate processes, to dice/singulate the wafer along scribe/dicing lines, resulting in individual sensor assemblies 10. The sensor assembly 10 can be connected to an external circuit 48 (flexible or rigid substrate/PCB) with contact pads 50 and traces or circuitry 52 using the BGA interconnects 46, as illustrated in FIG. 2L. Alternatively, in case of the LGA, interconnects using anisotropic conductive film (ACF) can be used.

Figure 2M:
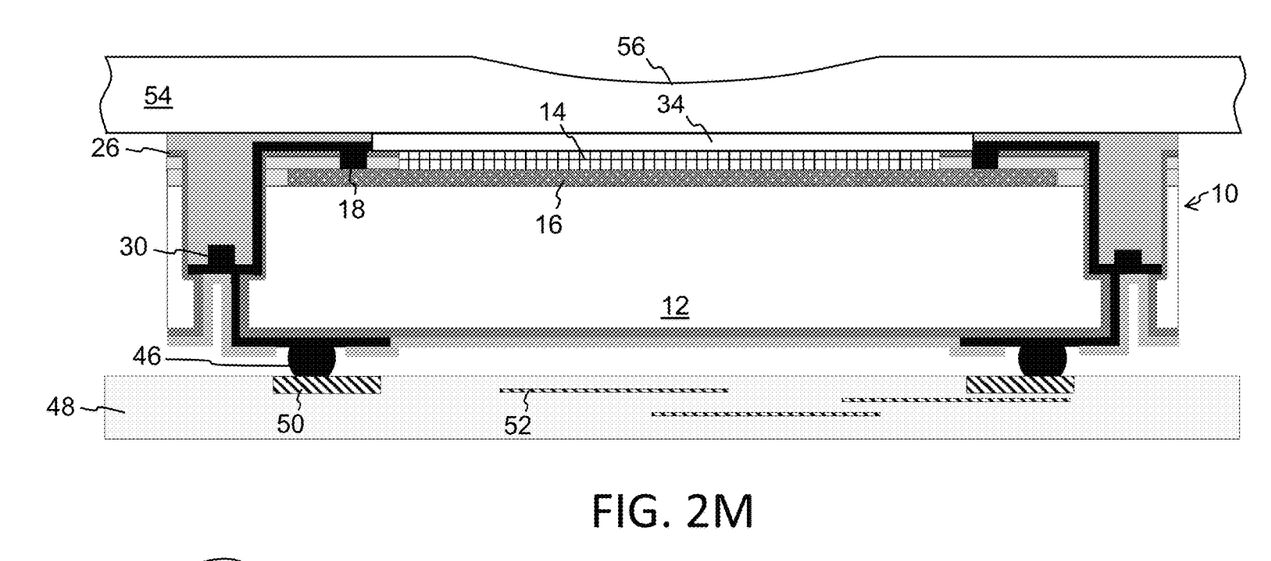
Figure 3A:
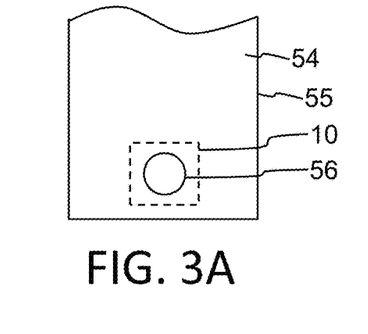
FIG. 3A is a top view of the cell phone front screen.
Figure 3B:
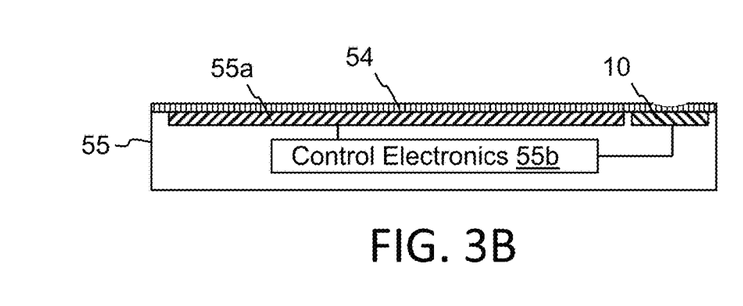
FIG. 3B is a side cross sectional plan view of the cell phone.

The sensor assembly 10 can be mounted directly to the underside of the front screen used for the electronic device in which the assembly 10 is used. For example, as shown in FIGS. 2M and 3A-3B, the sensor assembly 10 is mounted to the front screen 54 of a cell phone 55. Screen 54 is a dielectric such as plastic, glass or any other appropriate material that is used in the art. Optical transparency of the screen 54 is preferred but optional. The cell phone 55 includes the front screen 54, a visual display 55a mounted to (and preferably viewable through) the front screen 54, the sensor display 10 mounted to the front screen 54, and control electronics 55b for providing cell phone functionality (well known in the art) in response to signals from the sensor assembly 10. The screen 54 may also include layers of coatings and other electronic device structures. Optionally, the screen 54 may include a recessive (concave) area 56 in its upper surface directly over sensor 14 to enhance the sensor's sensitivity and/or ink coating in its internal surface. The sensitivity is increased due to the reduction in distance between the external environment and the sensor 14. The recessive area 56 can be formed by etching, mechanical milling or any other appropriate methods for the particular cover substrate 54. The recessive depth could be up to 50% of the screen's thickness. The sensor assembly 10 can be picked and placed on the backside of the cover substrate 54. An adhesive layer can be activated by heat, pressure, chemical agent or any other appropriate methods.

The packaged sensor shown in FIGS. 2M and 3A-3B has many advantages. First, the sensor assembly 10 mounts directly to the cell phone front screen 54, with no need for any special window or protrusion in the screen 54. Second, traces 28 carry sensor signals away from bond pads 18 on the top surface of the substrate with minimal added thickness. The minimal structure over the top surface of the substrate 12 (insulation 20, 26 and 32, and traces 28) means the distance between the sensor 14 and screen 54, and therefore the distance between the sensor 14 and the finger being detected at the surface of the screen 54, is minimal (for maximum sensor performance). The thickness of substrate 12 can be minimized because traces 28 and 42 extend through the substrate 12. Routing the sensor signals to the bottom side of the substrate 12 provides for the convenient and reliable electrical connections to the external PCB by interconnects 46.

Figure 4A:
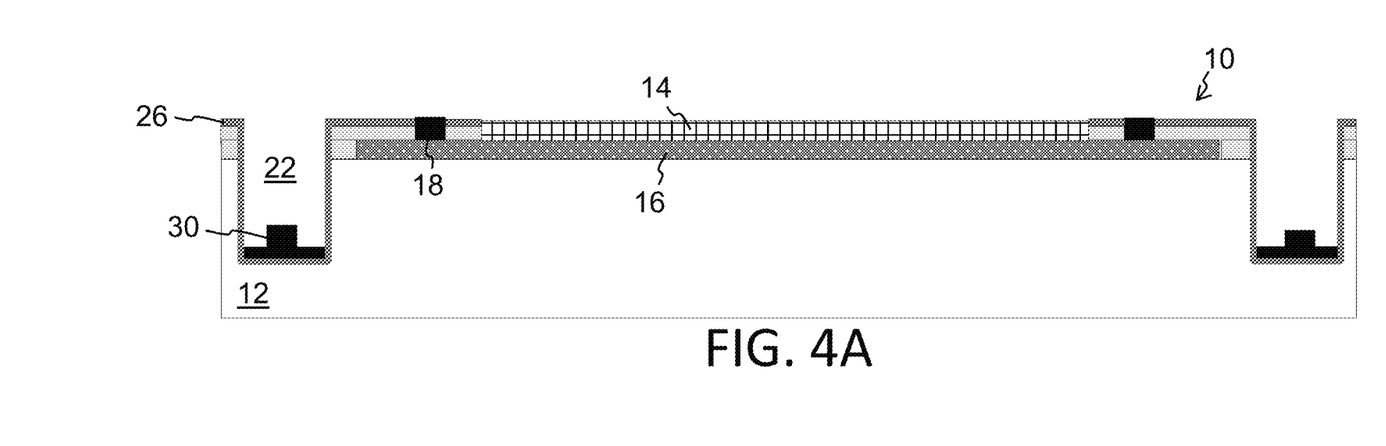
FIGS. 4A-4F are side cross sectional views illustrating the steps in forming an alternate embodiment of the sensor assembly of the present invention.
Figure 4B:
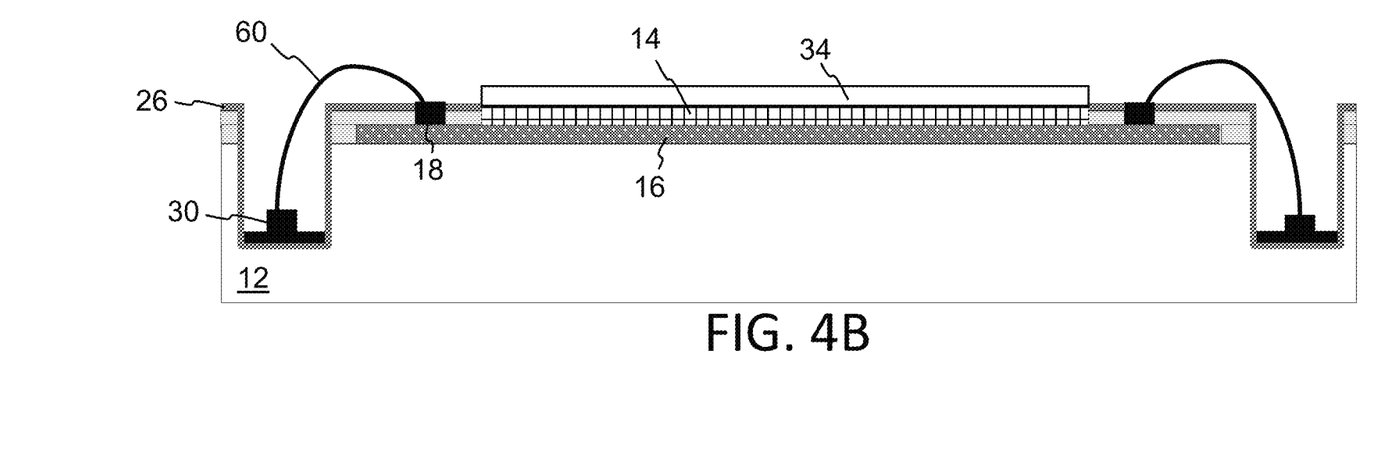

FIGS. 4A-4F illustrate the formation of an alternate embodiment that uses wires instead of traces to electrically connect to the bond pads 18 of the sensor assembly 10. The process begins with the structure shown in FIG. 2B. Instead of forming traces 28 that extend down into trenches 22 and form contact pads 30, the contact pads 30 are formed at the bottom of trenches 22 without any traces extending out of trenches 22 as shown in FIG. 4A. Protective material 34 is then formed over the sensor 14, as described above. A wire bonding process is then used to attach wires 60 each extending between (and providing an electrical connection between) one of the bond pads 18 and one of the bond pads 30, as shown in FIG. 4B.

Figure 4C:
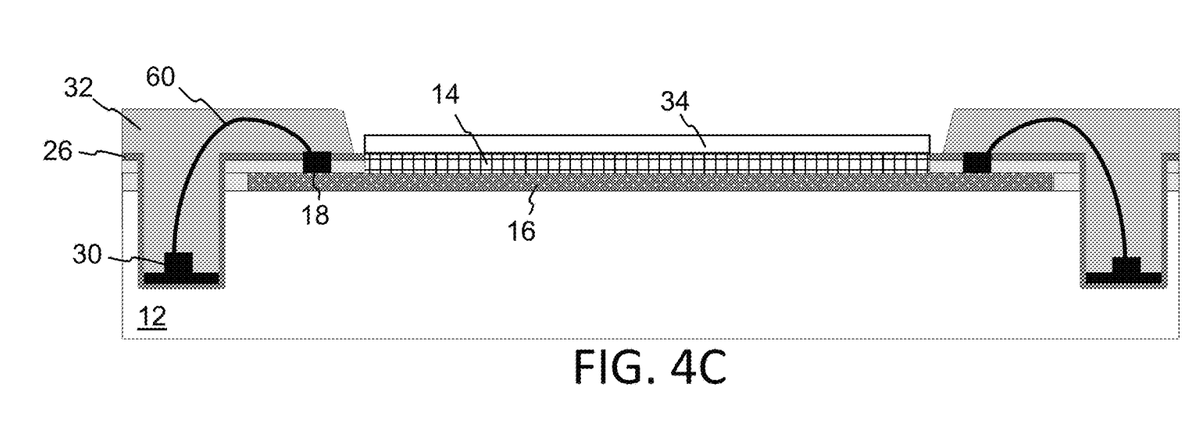
Figure 4D:
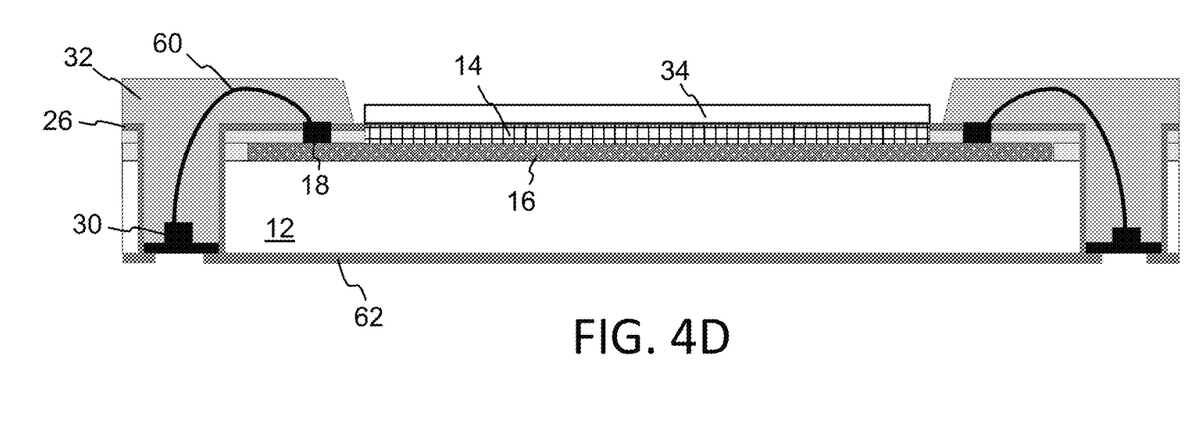

The dielectric encapsulant material 32 is then formed as discussed above, which covers the wires 60 but leaves the sensor 14 exposed, as shown in FIG. 4C. Substrate 12 is then thinned by recessing the bottom surface of the silicon substrate 12 until bond pads 30 are exposed from the bottom (removing insulation layer 26 as well). This bottom surface recessing can be done by mechanical grinding, chemical mechanical polishing (CMP), wet etching, atmospheric downstream plasma (ADP), dry chemical etching (DCE), or a combination of aforementioned processes or any another appropriate silicon thinning method(s) applied to the bottom surface of substrate 12. A layer of insulation material 62 is deposited on the bottom surface of the substrate 12. The entire bottom surface of substrate 12, or only portions thereof, can be recessed. Insulation layer 62 can be silicon dioxide, silicon nitride or a photo-imagable polymer material. Preferably, insulation layer 62 is made of at least 0.5 μm of silicon dioxide formed by Physical Vapor Deposition (PVD) or any another appropriate deposition method(s). A photolithography process and dry plasma etch are used to remove portions of the insulation layer 62 over the bond pads 30, as shown in FIG. 4D.

Figure 4E:
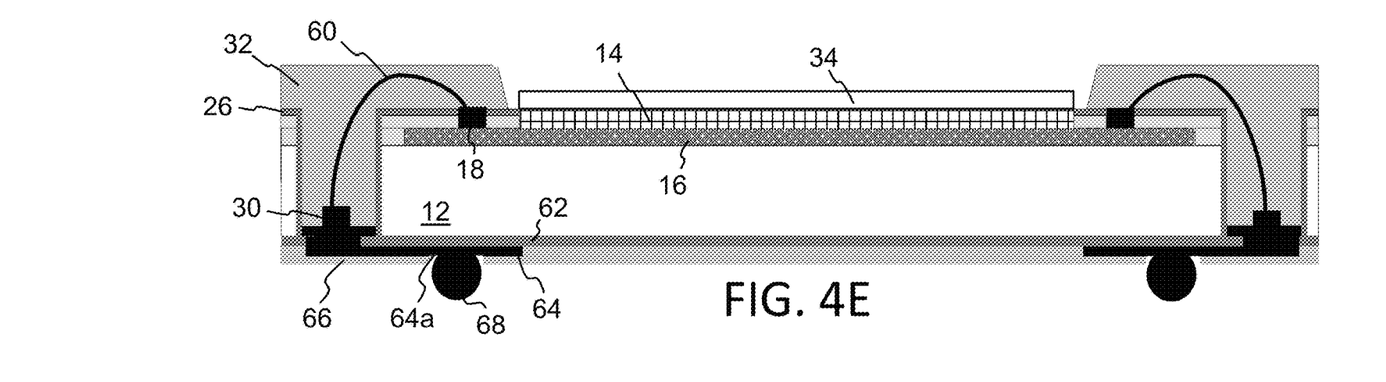
Figure 4F:
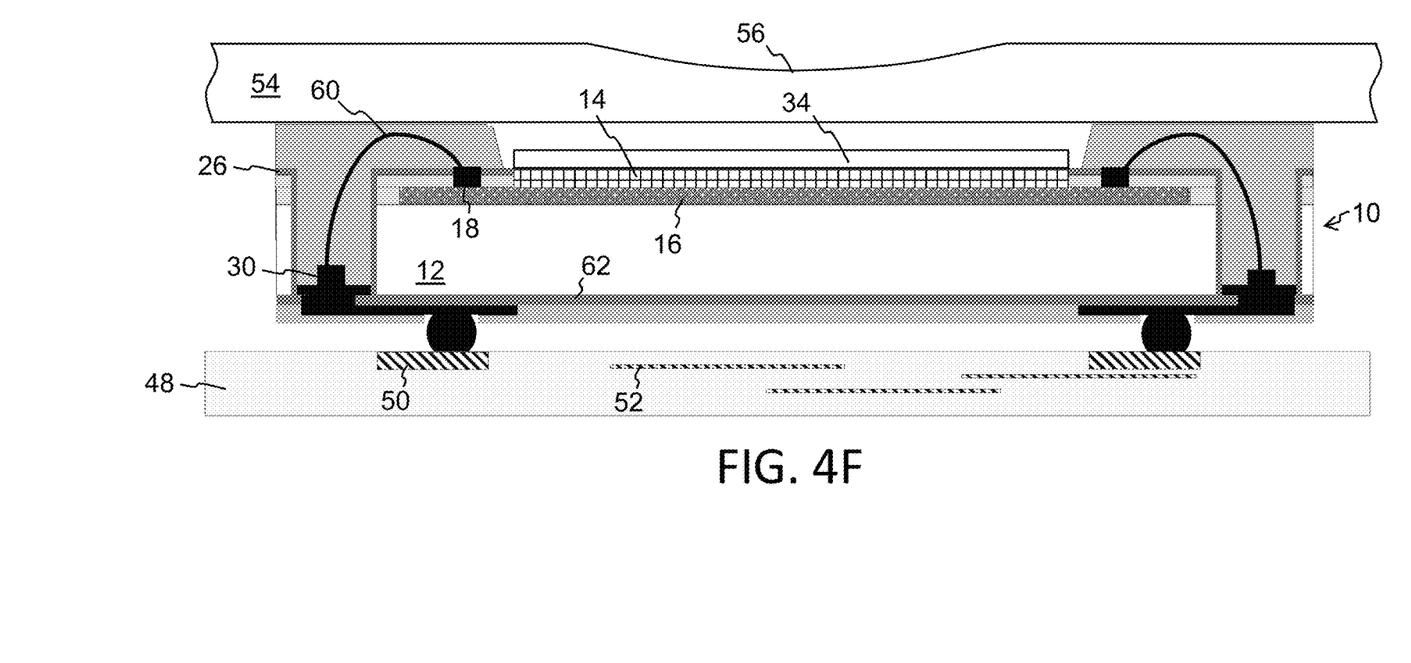

A layer of conductive material is formed on the bottom surface of the substrate 12, such as aluminum, copper or any other conductive material. Metallic material such as aluminum is preferred, and can be deposited by sputtering process. The conductive material is then selectively removed using a photolithographic process and etch leaving traces 64 thereof that each extend from one of the bond pads 30 and on insulation layer 62 along the bottom surface of substrate 12. Optionally, traces 64 can be Ni/Pd/Au plated. A dielectric encapsulant insulation layer 66 is deposited over the bottom surface of the substrate 12, including on traces 64. Selected portions of the layer 66 are removed (e.g. by photolithography and etch) to expose portions of the traces 64 that constitute bond pads 64a. Dielectric layer 66 can be silicon dioxide, silicon nitride, photo-imagable polymer, epoxy, etc. Preferably, dielectric layer 66 is made of a photo-imagable polymer. The photo-imagable material deposition method can be spin and/or spray coating any another appropriate deposition method(s). Interconnects 68 such as ball grid array (BGA) are formed on the bond pads 64a, as shown in FIG. 4E. Interconnects could instead be LGA, plated bumps, adhesive bumps, stud bumps or any other appropriate interconnection method. Stencil printing or ball placement techniques could be used for ball grid array formation. The structure is then singulated and mounted to the external PCB 48 and front screen 54 as described above, resulting in the final structure shown in FIG. 4F.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the packaged sensor assembly. Single layers of material could be formed as multiple layers of such or similar materials, and vice versa. Lastly, the terms "forming" and "formed" as used herein shall include material deposition, material growth, or any other technique in providing the material as disclosed or claimed.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A sensor assembly, comprising:
   a silicon substrate having opposing top and bottom surfaces;
   a sensor integrally formed on or in the top surface of the silicon substrate;
   a plurality of bond pads formed at the top surface of the silicon substrate and electrically coupled to the sensor;
   a trench formed into the top surface of the silicon substrate and extending toward but not reaching the bottom surface;
   a plurality of conductive first traces each extending from one of the bond pads, along the top surface of the silicon substrate, along a sidewall of the trench and along a bottom of the trench;
   one or more holes formed into the bottom surface of the silicon substrate and extending toward but not reaching the top surface, wherein the one or more holes terminating at the bottom of the trench in a manner exposing the plurality of conductive first traces;
   a plurality of conductive second traces each extending from one of the conductive first traces at the bottom of the trench, along a sidewall of the one or more holes, and along the bottom surface of the silicon substrate.

2. The sensor assembly of claim 1, further comprising:
   encapsulant material filling the trench and providing support to the conductive first traces at the bottom of the trench.

3. The sensor assembly of claim 1, wherein:
   the plurality of conductive first traces are insulated from the top surface of the silicon substrate and from the sidewall of the trench; and
   the plurality of conductive second traces are insulated from the bottom surface of the silicon substrate and from the sidewall of the one or more holes.

4. The sensor assembly of claim 1, wherein the one or more holes are a plurality of separate holes each of which having only one of the conductive second traces extending therein.

5. The sensor assembly of claim 1, wherein the one or more holes is a single hole having all of the conductive second traces extending therein.

6. The sensor assembly of claim 1, further comprising at least one of:
   a layer of protective material disposed over the sensor, and
   a protective substrate disposed over the sensor.

7. The sensor assembly of claim 1, further comprising:
   a plurality of interconnects each electrically connected to a portion of one of the conductive second traces disposed over the bottom surface.

8. The sensor assembly of claim 7, further comprising:
   a printed circuit board having a plurality of second bond pads, wherein each of the plurality of interconnects is electrically connected to one of the second bond pads.

9. A cell phone, comprising:
   a front screen;
   a visual display disposed under and viewable through the front screen;
   a sensor assembly disposed under and sensing an area of the front screen, wherein the sensor assembly comprises:
     a silicon substrate having opposing top and bottom surfaces,
     a sensor integrally formed on or in the top surface of the silicon substrate,
     a plurality of bond pads formed at the top surface of the silicon substrate and electrically coupled to the sensor,
     a trench formed into the top surface of the silicon substrate and extending toward but not reaching the bottom surface,
     a plurality of conductive first traces each extending from one of the bond pads, along the top surface of the silicon substrate, along a sidewall of the trench and along a bottom of the trench,
     one or more holes formed into the bottom surface of the silicon substrate and extending toward but not reaching the top surface, wherein the one or more holes terminating at the bottom of the trench in a manner exposing the plurality of conductive first traces, and
     a plurality of conductive second traces each extending from one of the conductive first traces at the bottom of the trench, along a sidewall of the one or more holes, and along the bottom surface of the silicon substrate; and
   control electronics electrically connected to the sensor assembly and the visual display.

10. The cell phone of claim 9, further comprising:
    encapsulant material filling the trench and providing support to the conductive first traces at the bottom of the trench.

11. The cell phone of claim 9, wherein the front screen includes a top surface with a recessed portion over the sensor assembly.

12. The cell phone of claim 9, wherein the front screen includes a bottom surface and the visual display and the sensor assembly are mounted to the bottom surface of the front screen.

13. The cell phone of claim 9, wherein:
the plurality of conductive first traces are insulated from the top surface of the silicon substrate and from the sidewall of the trench; and
the plurality of conductive second traces are insulated from the bottom surface of the silicon substrate and from the sidewall of the one or more holes.

14. The cell phone of claim 9, wherein the one or more holes are a plurality of separate holes each of which having only one of the conductive second traces extending therein.

15. The cell phone of claim 9, wherein the one or more holes is a single hole having all of the conductive second traces extending therein.

16. The cell phone of claim 9, further comprising at least one of:
a layer of protective material disposed between the sensor and the front screen, and
a protective substrate disposed between the sensor and the front screen.

17. The cell phone of claim 9, wherein the sensor assembly further comprises:
a plurality of interconnects each electrically connected to a portion of one of the conductive second traces disposed over the bottom surface.

18. The cell phone of claim 17, wherein the sensor assembly further comprises:
a printed circuit board having a plurality of second bond pads, wherein each of the plurality of interconnects is electrically connected to one of the second bond pads.

19. A sensor assembly, comprising:
a silicon substrate having opposing top and bottom surfaces;
a sensor integrally formed on or in the top surface of the silicon substrate;
a plurality of first bond pads formed at the top surface of the silicon substrate and electrically coupled to the sensor;
a trench extending between the top and bottom surfaces;
a plurality of second bond pads extending across the trench at the bottom surface;
a plurality of wires each extending from one of the first bond pads, into the trench and to one of the second bond pads; and
a plurality of conductive traces each extending from one of the second bond pads and along the bottom surface of the silicon substrate.

20. The sensor assembly of claim 19, further comprising:
encapsulant material filling the trench and providing support to the second bond pads at the bottom of the trench.

21. The sensor assembly of claim 19, wherein:
the plurality of conductive traces are insulated from the bottom surface of the silicon substrate.

22. The sensor assembly of claim 19, further comprising:
a plurality of interconnects each electrically connected to a portion of one of the conductive traces disposed over the bottom surface.

23. The sensor assembly of claim 22, further comprising:
a printed circuit board having a plurality of third bond pads, wherein each of the plurality of interconnects is electrically connected to one of the third bond pads.

24. A method of forming a sensor assembly, comprising:
providing a sensor die that includes:
a silicon substrate having opposing top and bottom surfaces,
a sensor integrally formed on or in the top surface of the silicon substrate, and
a plurality of first bond pads formed at the top surface of the silicon substrate and electrically coupled to the sensor;
forming a trench into the top surface of the silicon substrate that extends toward but does not reach the bottom surface;
forming second bond pads at a bottom of the trench;
connecting a plurality of wires between the first bond pads and the second bond pads;
filling the trenches with insulation material;
recessing the bottom surface of the silicon substrate to expose the second bond pads; and
forming a plurality of conductive traces each extending from one of the second bond pads and along the bottom surface of the silicon substrate.

25. The method of claim 24, wherein:
the plurality of conductive traces are insulated from the bottom surface of the silicon substrate.

26. The method of claim 24, further comprising:
forming a plurality of interconnects each electrically connected to a portion of one of the conductive traces disposed over the bottom surface.

27. The method of claim 24, further comprising:
electrically connecting each of the plurality of interconnects to one of a plurality of third bond pads of a printed circuit board.

* * * * *